United States Patent
Doglio et al.

(10) Patent No.: US 8,169,778 B2
(45) Date of Patent: May 1, 2012

(54) EMI SHIELDING SCHEME USING SANDWICHED SHEET METAL

(75) Inventors: Jean Doglio, Pflugerville, TX (US); Steven J. Zielnicki, Round Rock, TX (US); Vibora Sim, Pflugerville, TX (US)

(73) Assignee: Dell Products L.P., Round Rock, TX (US)

( * ) Notice: Subject to any disclaimer, the term of this patent is extended or adjusted under 35 U.S.C. 154(b) by 174 days.

(21) Appl. No.: 12/818,776

(22) Filed: Jun. 18, 2010

(65) Prior Publication Data

US 2011/0310546 A1 Dec. 22, 2011

(51) Int. Cl.
*G06F 1/16* (2006.01)

(52) U.S. Cl. .............. 361/679.02; 312/352; 345/208; 174/377; 439/607.01

(58) Field of Classification Search .............. 312/352, 312/220, 222, 223.1, 223.2; 361/725, 788, 361/818, 679.02, 679.29, 679.27, 679.39, 361/679.48, 679.23; 345/204, 87, 1.3, 208, 345/168, 92; 174/387, 378, 260, 377, 354, 174/565, 384; 439/607.25, 160, 40, 79, 65, 439/59, 607.01

See application file for complete search history.

(56) References Cited

U.S. PATENT DOCUMENTS

| | | | |
|---|---|---|---|
| 5,774,337 A * | 6/1998 | Lee et al. ................. | 361/725 |
| 6,570,755 B2 | 5/2003 | Curlee et al. | |
| 6,618,271 B1 | 9/2003 | Erickson et al. | |
| 6,858,794 B2 | 2/2005 | Jensen et al. | |
| 6,955,410 B1 * | 10/2005 | Nelson et al. ............. | 312/352 |
| 7,239,507 B1 | 7/2007 | Kim | |
| 2002/0118529 A1 * | 8/2002 | Babin et al. .............. | 361/818 |
| 2007/0153489 A1 | 7/2007 | Fan et al. | |

* cited by examiner

*Primary Examiner* — Hung Duong
(74) *Attorney, Agent, or Firm* — Hamilton & Terrile, LLP; Stephen A. Terrile

(57) ABSTRACT

A peripheral card EMI shielding scheme which comprises a sandwich of three layers. The first layer comprises a chassis rear wall (e.g., constructed of sheet metal). The next layer, which in certain embodiments is the middle of the sandwich, comprises a relatively thin plate (e.g., 0.15 mm+/−0.1 mm) with spring arms. The third layer comprises a sheet metal plate (in certain embodiments, the third layer has a similar thickness to the rear wall). The thick sheet metal plate completely covers the thin plate, except for areas where the spring arms protrude. The three plates are staked together by a method similar to an extrude-and-roll process (e.g., where one piece is fastened to another without the need for additional hardware or welding).

12 Claims, 6 Drawing Sheets

EMI SHIELDING SCHEME USING SANDWICHED SHEET METAL

BACKGROUND OF THE INVENTION

1. Field of the Invention

The present invention relates to information handling systems and more particularly to electro magnetic interference (EMI) shielding of information handling systems.

2. Description of the Related Art

As the value and use of information continues to increase, individuals and businesses seek additional ways to process and store information. One option available to users is information handling systems. An information handling system generally processes, compiles, stores, and/or communicates information or data for business, personal, or other purposes thereby allowing users to take advantage of the value of the information. Because technology and information handling needs and requirements vary between different users or applications, information handling systems may also vary regarding what information is handled, how the information is handled, how much information is processed, stored, or communicated, and how quickly and efficiently the information may be processed, stored, or communicated. The variations in information handling systems allow for information handling systems to be general or configured for a specific user or specific use such as financial transaction processing, airline reservations, enterprise data storage, or global communications. In addition, information handling systems may include a variety of hardware and software components that may be configured to process, store, and communicate information and may include one or more computer systems, data storage systems, and networking systems.

One important aspect in the design of information handling systems is the shielding of electromagnetic energy. In the design of most information handling systems, it is desirable to shield the system from unwanted electromagnetic interference from external sources, as well as to contain electromagnetic energy generated by the system itself. Furthermore, certain government regulations (e.g., Federal Communications Commission requirements) may necessitate that electronic systems be designed to contain electromagnetic noise within certain specifications.

Often with information handling systems, grounding is desirable between a peripheral card and its slot in the chassis to provide sufficient EMI containment. There are several known issues relating to providing this grounding. For example, it is desirable to provide a chassis structure which rather then including die cast rear wall uses sheet metal structure, which would inherently reduce the stiffness of the chassis. Also for example, often it is determined late in a design process that a particular EMI suppression feature is no longer needed. In this case, the decision to remove an EMI feature generally results in undesirable changes to hard tooling. Also for example, known solutions are often prone to being damaged during handling and normal use.

Known methods of peripheral card EMI suppression generally relate to one of two types of designs. A first design uses a thin metal plate attached to the chassis which contains spring arms or clips that contact the card mounting bracket. Another design uses a fabric over foam gasket adhered to the chassis which contacts the card mounting bracket. Each of these methods has inherent issues. For example, the fabric over foam gaskets can easily be sheared off, peeled off, or deformed, and also reduce possible venting areas. Alternately, the thin metal plates are often very flimsy and easy to snag, rip, and deform.

Accordingly, it is desirable to provide an EMI shielding scheme which addresses and improves upon all three of these issues. It is also desirable to provide an EMI shielding scheme which reduces costs associated with this portion of the chassis.

SUMMARY OF THE INVENTION

In accordance with the present invention, a peripheral card EMI shielding scheme is set forth. The EMI shielding scheme comprises a sandwich of three layers. The first layer comprises a chassis rear wall (e.g., constructed of sheet metal). The next layer, which in certain embodiments is the middle of the sandwich, comprises a relatively thin plate (e.g., 0.15 mm+/−0.1 mm) with spring arms. The third layer comprises a sheet metal plate (in certain embodiments, the third layer has a similar thickness to the rear wall). The thick sheet metal plate completely covers the thin plate, except for areas where the spring arms protrude. The three plates are staked together by a method similar to an extrude-and-roll process (e.g., where one piece is fastened to another without the need for additional hardware or welding).

By providing the third layer of sheet metal (the thick plate), the EMI shielding scheme substantially increases the stiffness of the rear wall and also protects the thin spring-arm plate from being damaged. Also, if it is determined that the EMI springs are not needed during the development process (even late in the development process), the thin plate can be eliminated without affecting any other parts of the EMI shield design. More specifically, in one embodiment, the spring arms comprise substantially rectangular spring arms. In another embodiment, the spring arms conform to a substantially a half-circle profile.

The peripheral card EMI shielding scheme improves chassis stiffness, allows the EMI shield to be removed later in the development cycle with no affect to chassis tooling, and reduces the likelihood of the EMI shield getting damaged. Also, the EMI shielding scheme provides a lower cost than the existing die cast with fabric-over-foam solution (e.g., in certain embodiments such an EMI shielding scheme provides an initial savings estimate of $3.00 or more per chassis).

BRIEF DESCRIPTION OF THE DRAWINGS

The present invention may be better understood, and its numerous objects, features and advantages made apparent to those skilled in the art by referencing the accompanying drawings. The use of the same reference number throughout the several figures designates a like or similar element.

DETAILED DESCRIPTION

Figure 1:
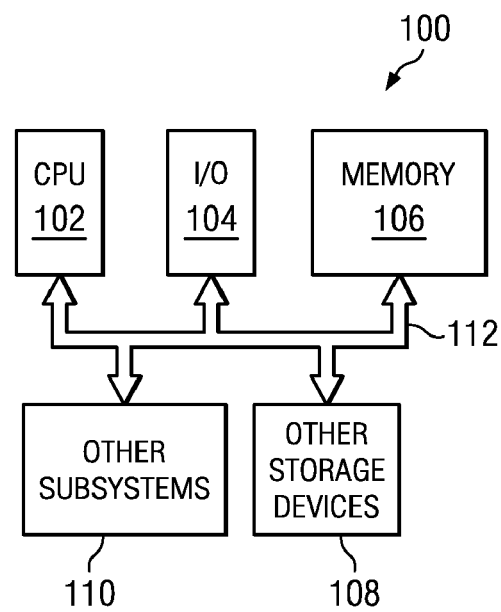
FIG. 1 shows a system block diagram of an information handling system.

Referring briefly to FIG. 1, a system block diagram of an information handling system 100 is shown. The information handling system 100 includes a processor 102, input/output (I/O) devices 104, such as a display, a keyboard, a mouse, and associated controllers (each of which may be coupled remotely to the information handling system 100), a memory 106 including volatile memory such as random access memory (RAM) and non-volatile memory such as a hard disk and drive, and other storage devices 108, such as an optical disk and drive and other memory devices, and various other subsystems 110, all interconnected via one or more buses 112.

For purposes of this disclosure, an information handling system may include any instrumentality or aggregate of instrumentalities operable to compute, classify, process, transmit, receive, retrieve, originate, switch, store, display, manifest, detect, record, reproduce, handle, or utilize any form of information, intelligence, or data for business, scientific, control, or other purposes. For example, an information handling system may be a personal computer, a network storage device, or any other suitable device and may vary in size, shape, performance, functionality, and price. The information handling system may include random access memory (RAM), one or more processing resources such as a central processing unit (CPU) or hardware or software control logic, ROM, and/or other types of nonvolatile memory. Additional components of the information handling system may include one or more disk drives, one or more network ports for communicating with external devices as well as various input and output (I/O) devices, such as a keyboard, a mouse, and a video display. The information handling system may also include one or more buses operable to transmit communications between the various hardware components.

Figure 2:
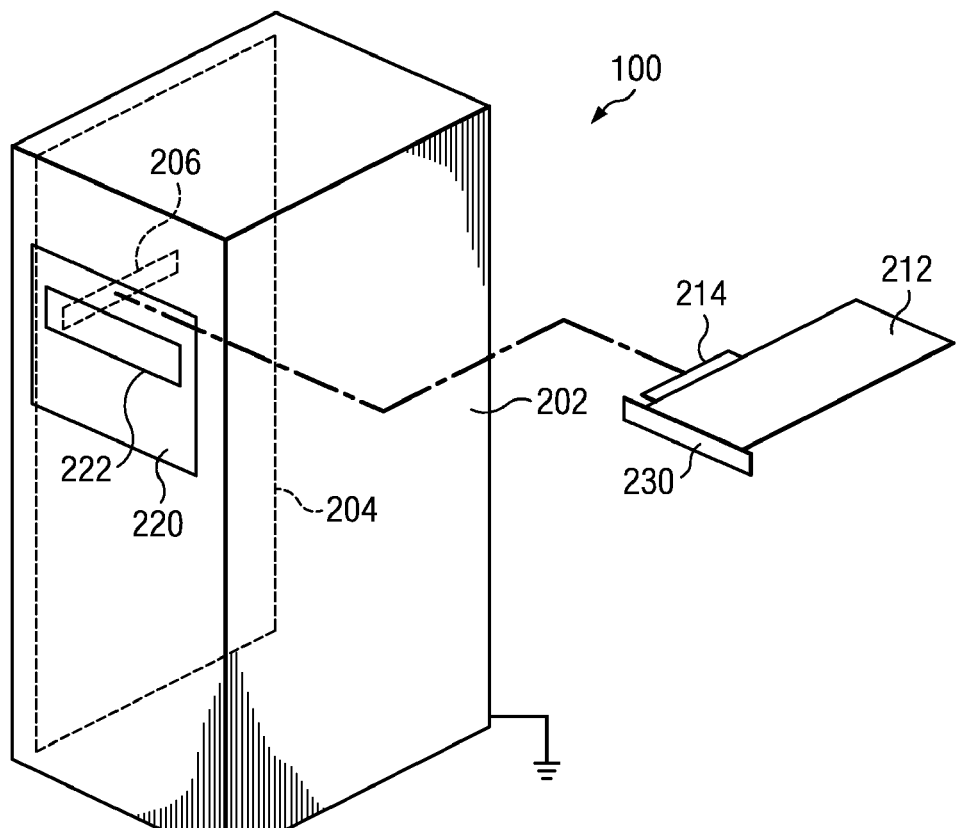
FIG. 2 shows a structural block diagram of an information handling system.

Referring to FIG. 2, a structural block diagram of an information handling system 100 is shown. The information handling system 100 includes a chassis 202. A system board 204, including a peripheral card slot 206, is mounted within the chassis 202. The system board 204 may include a plurality of electronic components (such as the components discussed with respect to the system block diagram of the information handling system 100 shown in FIG. 1) that are capable of generating electromagnetic energy when operating. The peripheral card slot 210 is configured for receiving a peripheral card such as peripheral card 212. In one embodiment, peripheral card slot 210 includes a connector configured to receive an edge connector, such as edge connector 214 of peripheral card 212. The peripheral card slot 210 and peripheral card 212 may conform to various types of standards, such as the PCI (Peripheral Component Interface) standard.

In addition to the system board 204 and peripheral card 212, other circuit carriers and electronic devices may also be present in information handling system 100. This may include (but is not limited to) additional peripheral cards, electronic devices mounted upon the system board (e.g., processors, memory, etc.), storage devices, and so forth.

The chassis 202 includes a frame 220 positioned near the peripheral card slot 210. The frame 220 defines an opening 222 adjacent to peripheral card slot 210 which may allow for any required external connections to the peripheral card 212, if present. When the peripheral card 212 is mounted to the system board 204 (e.g., via the peripheral card slot 210), a shield bracket 230 (attached to peripheral card 212) may cover the opening 222. Both the shield bracket 230 and the frame 220 may be made of an electrically conductive material (e.g., stainless steel, copper, beryllium, a conductive alloy, etc.).

Both the shield bracket 230 and frame 220 are made of an electrically conductive material. In addition, chassis 202 may be made of electrically conductive material, or may at least include a substantial amount of electrically conductive material. Furthermore, chassis 202 may be coupled to an electrical ground, and as such, frame 220 may also be coupled to the electrical ground through chassis 202. Thus, the combination of chassis 202, frame 220, and shield bracket 230 provide shielding to prevent (or reduce) the escape of electromagnetic energy generated by electronic devices contained within the confines of the chassis 202. Similarly, the combination of these elements may also prevent (or reduce) externally generated electromagnetic energy from entering the chassis and causing electromagnetic interference (EMI).

Figure 3:
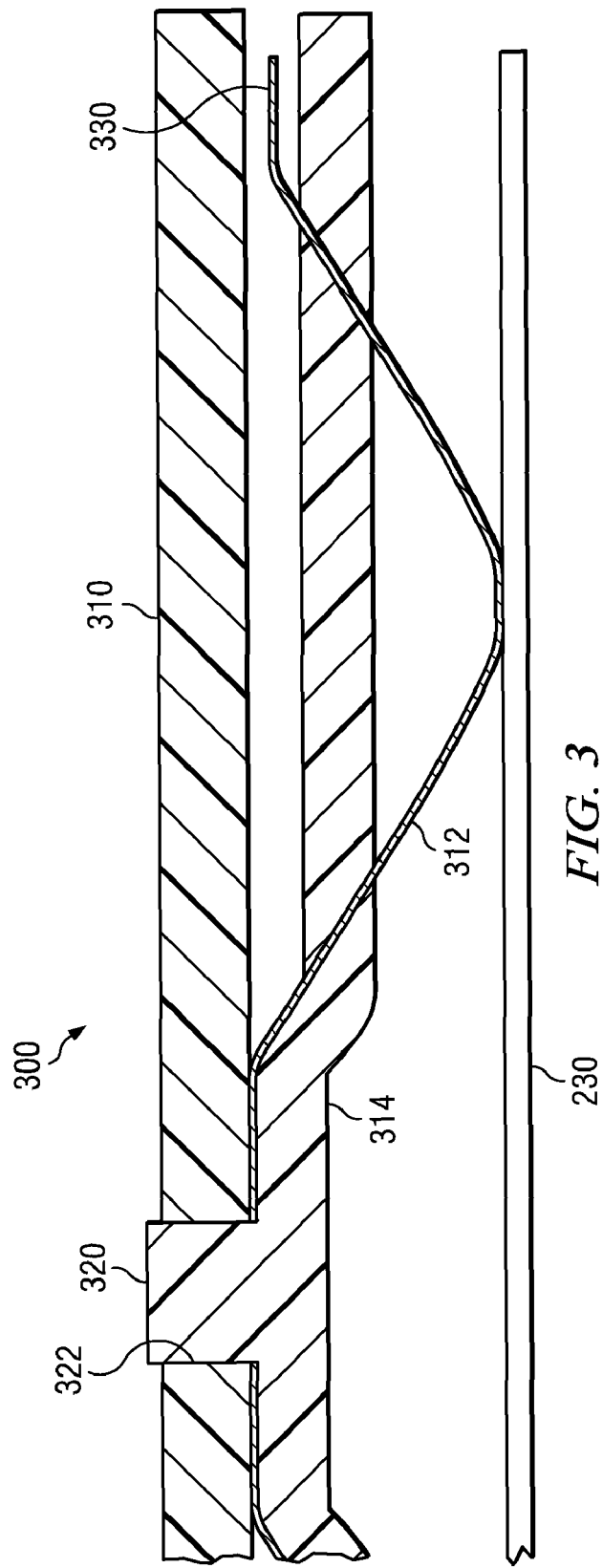
FIG. 3 shows a cross sectional view of a peripheral card EMI shielding scheme.
Figure 4:
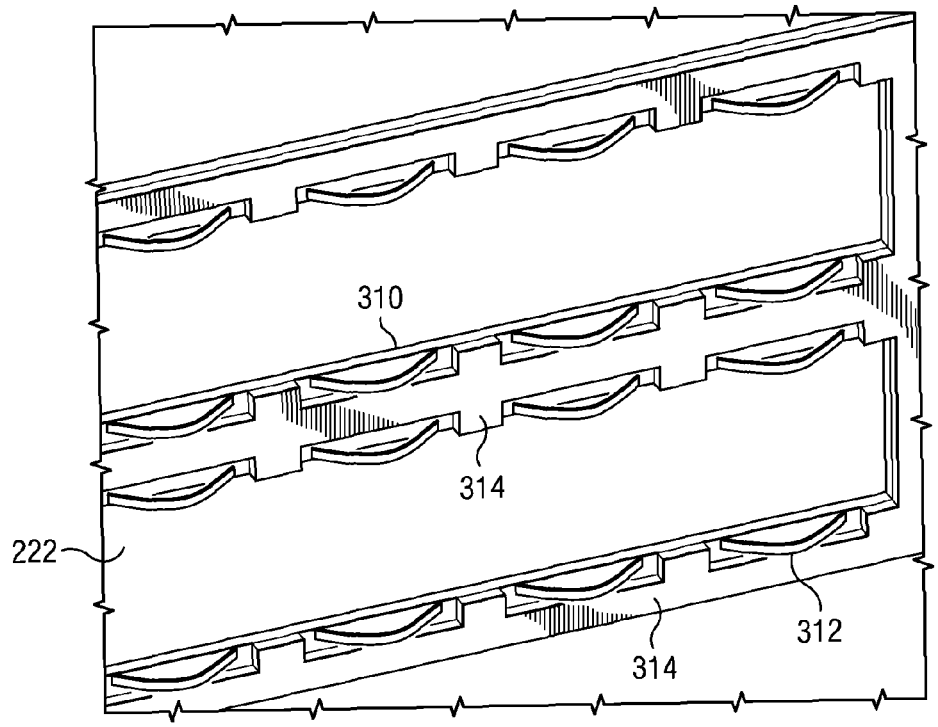
FIG. 4 shows a perspective view of a peripheral card EMI shielding scheme.
Figure 5:
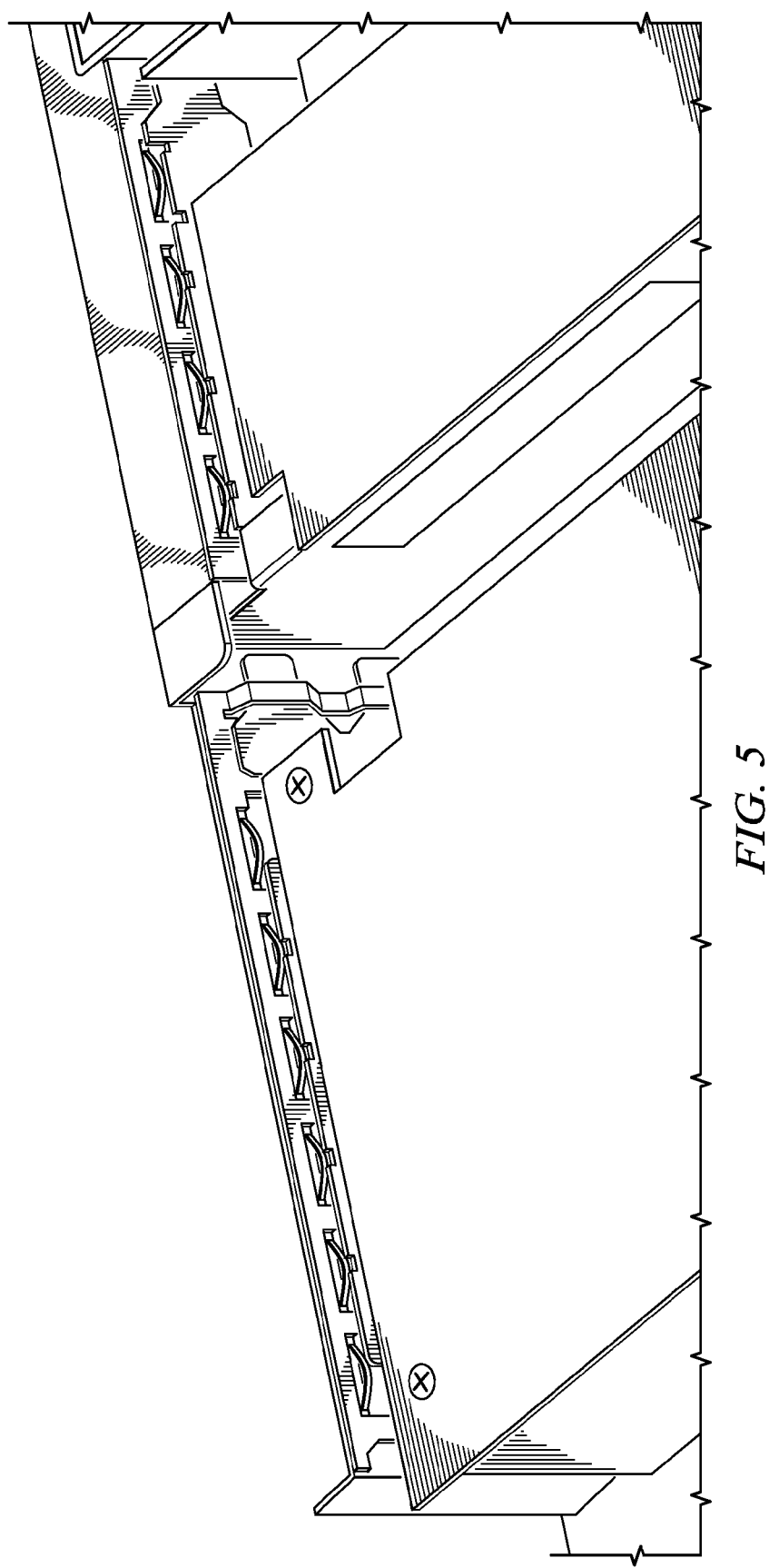
FIG. 5 shows a perspective view of a rear portion of an information handling system using a peripheral card EMI shielding scheme.

FIG. 3 shows a cross sectional view of a peripheral card EMI shielding scheme 300. FIG. 4 shows a perspective view of a peripheral card EMI shielding scheme 300. FIG. 5 shows a perspective view of a rear portion of an information handling system using a peripheral card EMI shielding scheme.

The EMI shielding scheme 300 comprises a sandwich of three layers. The first layer comprises a chassis rear wall (e.g., constructed of sheet metal) which is about 1 mm thick. The next layer, which in certain embodiments is the middle of the sandwich, comprises a relatively thin plate (e.g., 0.15 mm+/−0.1 mm) with spring arms. The third layer comprises a sheet metal plate (in certain embodiments, the third layer has a similar thickness to the rear wall). The thick sheet metal plate completely covers the thin plate, except for areas where the spring arms protrude. The three plates are staked together by a method similar to an extrude-and-roll process (e.g., where one piece is fastened to another without the need for additional hardware or welding). By providing the first and third layers as sheet metal, the cost of providing the EMI shielding scheme is reduced when compared with the cost of a die cast frame.

By providing the third layer of sheet metal (the thick plate), the EMI shielding scheme substantially increases the stiffness of the rear wall (which in server environments helps to reduce sagging of the frame) and also protects the thin spring-arm plate from being damaged. Also, because the second layer is relatively thin when compared with the first and third layers (e.g., 15% (+/−10%) of the thickness of each of the other layers) and also because this second layer is not integral with the first and third layers, if it is determined that the EMI springs are not needed during the development process (even late in the development process), the thin plate can be eliminated without affecting any other parts of the EMI shield design. This thin layer is within the tolerances of the thickness of the overall structure so removing this layer late in the development process does not affect other aspects of the frame design. In one embodiment, the spring arms comprise substantially rectangular spring arms.

With the EMI shielding scheme 300, extruded extensions 320 coupled with extruded holes 320 to secure the sandwich together. Also, the scheme 300 includes relatively small gaps (e.g., 0.1-0.2 mm) to allow the spring arm to translate from an unloaded position (as shown in FIG. 3) to a loaded position (not shown). Also, the end of the spring arm 330 is captive between the chassis wall (i.e., the first layer) and the thick plate (i.e., the third layer), thus providing protection for the end of the spring arm and making it more difficult to damage the end of the spring arm.

The present invention is well adapted to attain the advantages mentioned as well as others inherent therein. While the present invention has been depicted, described, and is defined by reference to particular embodiments of the invention, such references do not imply a limitation on the invention, and no such limitation is to be inferred. The invention is capable of considerable modification, alteration, and equivalents in form and function, as will occur to those ordinarily skilled in the pertinent arts. The depicted and described embodiments are examples only, and are not exhaustive of the scope of the invention.

Figure 6:
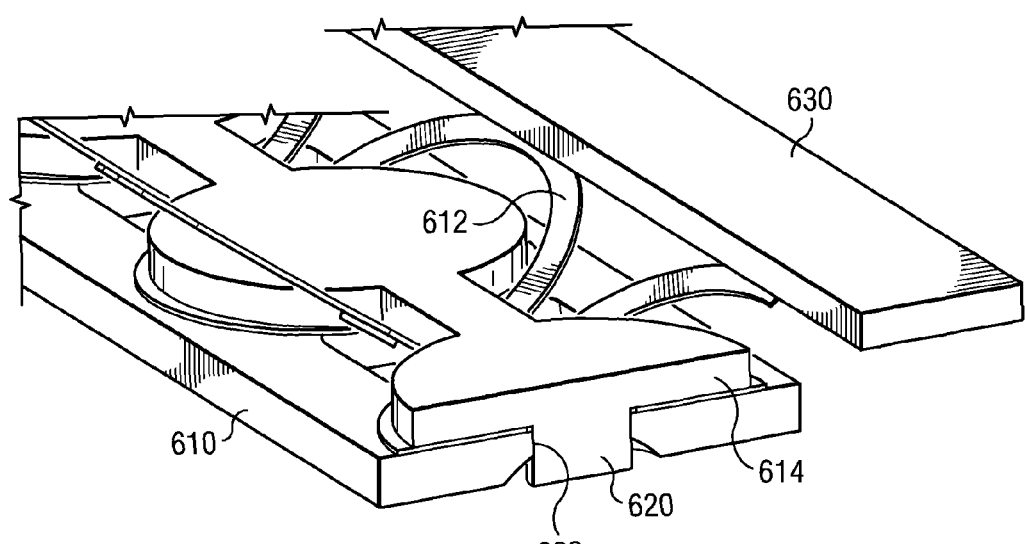
FIG. 6 shows an expanded perspective view of an alternate peripheral card EMI shielding scheme.
Figure 7:
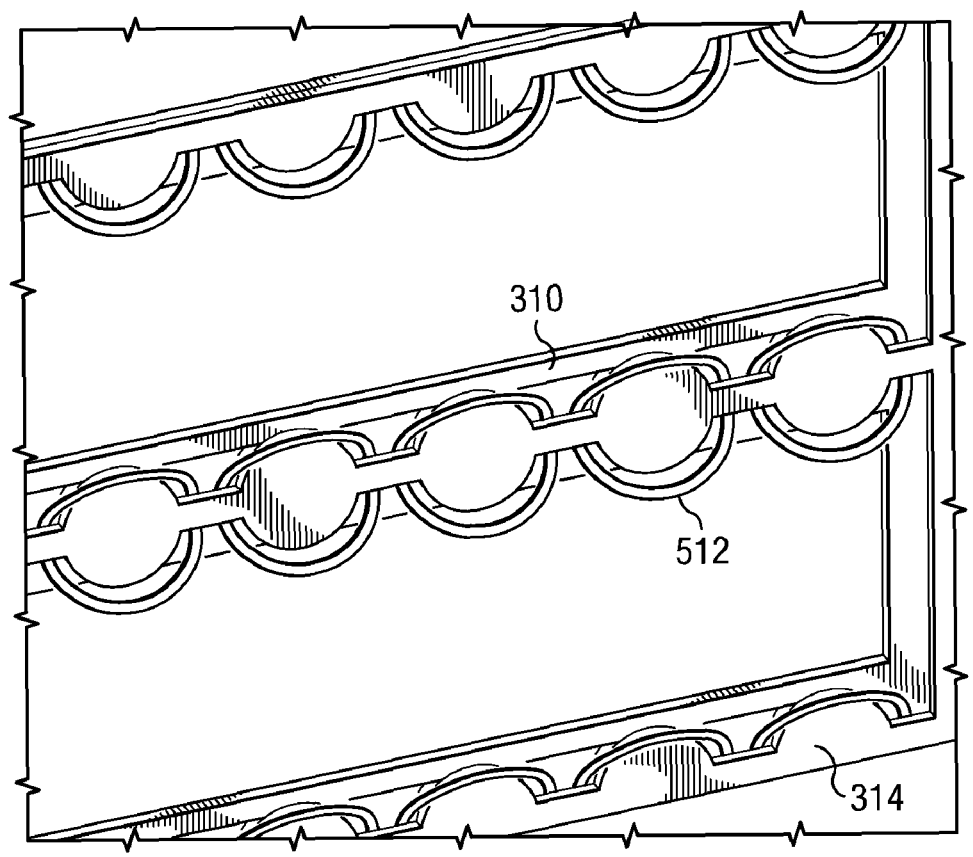
FIG. 7 shows a perspective view of an alternate peripheral card EMI shielding scheme.
Figure 8:
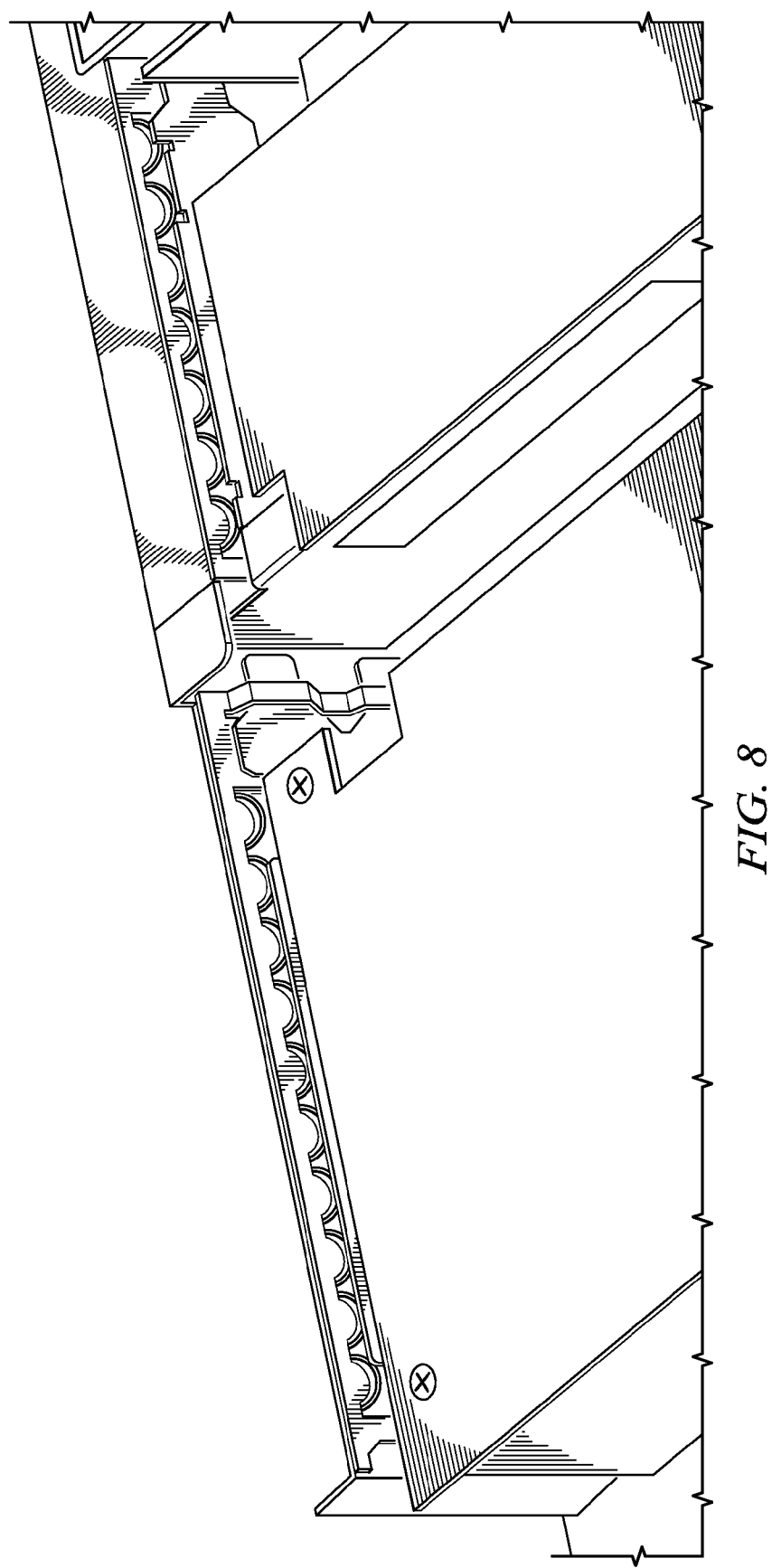
FIG. 8 shows a perspective view of a rear portion of an information handling system using an alternate peripheral card EMI shielding scheme.

For example, FIG. 6 shows an expanded perspective view of an alternate peripheral card EMI shielding scheme. FIG. 7 shows a perspective view of an alternate peripheral card EMI shielding scheme. FIG. 8 shows a perspective view of a rear portion of an information handling system using an alternate peripheral card EMI shielding scheme. In the alternate peripheral card EMI shielding scheme, a first layer 610, a spring arm layer 612 and a third layer 614 are included where the spring arms 612 conform to a substantially a half-circle profile. The first layer 612 defines holes 620 into which a protrusions 622 from the third layer are inserted for securing the sandwich together.

Consequently, the invention is intended to be limited only by the spirit and scope of the appended claims, giving full cognizance to equivalents in all respects.

What is claimed is:

1. An apparatus for reducing electro magnetic interference (EMI) associated with mounting peripheral cards in an information handling system, the apparatus comprising:
   a chassis;
   a frame, the frame mounted on the chassis, the frame comprising at least one opening adjacent to a peripheral card slot, the frame comprising an EMI reduction scheme, the EMI reduction scheme comprising a first layer, a second layer and a third layer, the second layer being sandwiched between the first layer and the third layer, the second layer comprising a plurality of spring arms arranged around the opening, the first layer, second layer and third layer comprising electrically conductive material; and
   a shield bracket, the shield bracket configured for coupling with the plurality of spring arms arranged around the opening, the shield bracket comprising electrically conductive material.

2. The apparatus of claim 1 wherein:
   the second layer comprises a relatively thin plate relative to a thickness of the first layer and the third layer.

3. The apparatus of claim 1 wherein:
   the first layer comprises a sheet metal plate; and,
   the third layer comprises a sheet metal plate, the sheet metal plate of the third layer completely covering the second layer but for areas where the spring arms protrude.

4. The apparatus of claim 1 wherein:
   the three layers are staked together so that the layers are fastened together without a need for additional hardware or welding.

5. The apparatus of claim 1 wherein:
   the first layer and the third layer define a gap; and,
   the plurality of spring arms comprise respective ends, the respective ends fitting within the gap defined by the first layer and the third layer, the gap allowing the plurality of spring arms to translate from an un loaded position to a loaded position.

6. The apparatus of claim 1 wherein:
   the plurality of spring arms comprise at least one of a rectangular profile and a half circle shape.

7. An information handling system comprising
   a processor;
   memory coupled to the processor;
   a chassis, the processor and the memory being contained within the chassis;
   a frame, the frame mounted on the chassis, the frame comprising at least one opening adjacent to a peripheral card slot, the frame comprising an EMI reduction scheme, the EMI reduction scheme comprising a first layer, a second layer and a third layer, the second layer being sandwiched between the first layer and the third layer, the second layer comprising a plurality of spring arms arranged around the opening, the first layer, second layer and third layer comprising electrically conductive material; and
   a shield bracket, the shield bracket configured for coupling with the plurality of spring arms arranged around the opening, the shield bracket comprising electrically conductive material.

8. The information handling system of claim 7 wherein:
   the second layer comprises a relatively thin plate relative to a thickness of the first layer and the third layer.

9. The information handling system of claim 7 wherein:
   the first layer comprises a sheet metal plate; and,
   the third layer comprises a sheet metal plate, the sheet metal plate of the third layer completely covering the second layer but for areas where the spring arms protrude.

10. The information handling system of claim 7 wherein:
    the three layers are staked together so that the layers are fastened together without a need for additional hardware or welding.

11. The information handling system of claim 7 wherein:
    the first layer and the third layer define a gap; and,
    the plurality of spring arms comprise respective ends, the respective ends fitting within the gap defined by the first layer and the third layer, the gap allowing the plurality of spring arms to translate from an un loaded position to a loaded position.

12. The information handling system of claim 7 wherein:
    the plurality of spring arms comprise at least one of a rectangular profile and a half circle shape.

* * * * *